United States Patent
Jang et al.

(10) Patent No.: US 6,274,514 B1
(45) Date of Patent: Aug. 14, 2001

(54) HDP-CVD METHOD FOR FORMING PASSIVATION LAYERS WITH ENHANCED ADHESION

(75) Inventors: Syun-Ming Jang, Hsin-Chu; Chu-Yun Fu, Taipei, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/336,807

(22) Filed: Jun. 21, 1999

(51) Int. Cl.[7] .......................... H01L 21/31; H01L 21/469
(52) U.S. Cl. .......................... 438/778; 438/798; 438/127
(58) Field of Search .......................... 438/778, 666, 438/667, 668, 672, 673, 688, 680, 622, 127, 124, 122, 623–626

(56) References Cited

U.S. PATENT DOCUMENTS

| 5,494,854 | 2/1996 | Jain . | |
|---|---|---|---|
| 5,756,380 | 5/1998 | Berg | 438/126 |
| 5,759,906 | * 6/1998 | Lou | 438/623 |
| 5,804,259 | 9/1998 | Robles | 427/577 |
| 5,807,768 | * 9/1998 | Shin | 438/127 |
| 6,046,106 | * 4/2000 | Tran et al. | 438/660 |
| 6,087,278 | * 7/2000 | KIm et al. | 438/978 |

* cited by examiner

Primary Examiner—David Nelms
Assistant Examiner—Dung A Le
(74) Attorney, Agent, or Firm—George O. Saile; Stephen B. Ackerman; Alek P. Szecsy

(57) ABSTRACT

A method for forming upon a substrate employed within a microelectronics fabrication a dielectric passivating layer with attenuated delamination and improved adhesion to subsequent passivating and encapsulating materials. There is first provided a substrate employed within a microelectronics fabrication. There is then formed upon the substrate a patterned microelectronics layer. There is then formed over the substrate a silicon containing dielectric layer employing high density plasma chemical vapor deposition (IDP-CVD) in two steps, wherein the conditions of the HDP-CVD process are optimized during the second step to provide a final layer portion with a greater degree of surface topography. Subsequently there are formed over the substrate an additional passivation layer with attenuated delamination and an organic polymer overcoat layer with improved adhesion.

13 Claims, 1 Drawing Sheet

HDP-CVD METHOD FOR FORMING PASSIVATION LAYERS WITH ENHANCED ADHESION

BACKGROUND OF THE INVENTION

1. Field of the Invention

The invention relates to the field of dielectric layers employed within microelectronics fabrications. More particularly, the invention relates to the field of delamination resistant dielectric layers employed for passivation of microelectronics fabrications.

2. Description of the Related Art.

As the dimensions of microelectronics fabrications have decreased, the sensitivity of such devices to environmental factors has required that the methods for passivation and protection of microelectronics fabrications be improved. Microelectronics fabrications are passivated and protected primarily by insuring that the surfaces of the fabrications be covered and sealed with impervious coatings of chemically and physically stable materials, and secondarily by placing the completed fabrication with its attendant electrical leads and connections within another protective enclosure or "package" so that the device may be handled and employed as designed with reasonable security from any potentially harmful environment. To insure adequate protection, the protective structures must be inherently free from porosity and their fabrication must insure freedom from cracks or defects at joints, interfaces and seams.

The primary passivation of microelectronics fabrications, particularly those employing semiconductor materials which are especially sensitive to extremely small chemical or physical changes at their surfaces, is generally achieved by forming individual or composite surface layers of silicon containing dielectric materials such as silicon oxide or silicon nitride because of the excellent physical and chemical stability of these materials and their relative ease of formation and methods of shaping. The secondary protective methods, or packaging, of microelectronics fabrications generally employ thermoplastic or thermosetting organic polymer materials molded as overcoating layers around the microelectronics fabrication with its attendant attached leads and connections. This method is particularly widely employed in situations where manufacturing cost is an important factor and environmental conditions for use of the device are not very severe.

Although satisfactory methods of passivation with silicon containing dielectric materials and packaging with molded organic polymer materials are available for microelectronics fabrications, these methods of protecting microelectronics fabrications are not without problems. In particular, composite silicon containing dielectric layers and molded organic polymer materials formed around devices coated with silicon containing passivation layers often experience difficulties due to poor adhesion of the molded organic polymer material to surfaces typical of silicon containing dielectric layers, as well as delamination between the composite layers.

It is towards the goal of providing enhanced adhesion of protective layers and coatings to microelectronics fabrications that the present invention is generally and more specifically directed.

Various methods have been disclosed for forming passivation layers and protective packaging enclosures upon microelectronics fabrications.

For example, Jain, in U.S. Pat. No. 5,494,854, discloses a method for forming a planarized dielectric passivation layer upon a patterned layer semiconductor microelectronics fabrication. The method first forms a gap filling silicon oxide dielectric layer by high density plasma chemical vapor deposition, followed by a second silicon oxide dielectric layer formed by plasma enhanced chemical vapor deposition and subsequent chemical mechanical polish (CMP) planarization.

Further, Berg et al., in U.S. Pat. No. 5,756,380, disclose a method for forming a moisture resistant microelectronics fabrication employing an organic substrate which is resistant to delamination or cracking at interfaces. The method employs organic polymer materials for attachment of the microelectronics fabrication to the substrate and for overall encapsulation.

Still further, Lou, in U.S. Pat. No. 5,759,906, discloses a method for forming a planarized inter-level metal dielectric (IMD) layer with via contact holes on integrated circuit microelectronics fabrications. The method employs combinations of dielectric layers formed employing plasma enhanced chemical vapor deposition (PECVD) and low dielectric constant dielectric layers formed from spin-on-glass (SOG) dielectric materials as well as chemical mechanical polish (CMP) planarization to realize the planar inter-level metal dielectric (IMD) layer. Multiple baking steps between fabrication of layers is employed to minimize via contact hole poisoning.

Yet still further, Robles, in U.S. Pat. No. 5,804,259, discloses a method for forming a multi-layer low dielectric constant dielectric layer on a substrate. The method employs forming a first layer of carbonaceous diamond-like dielectric material followed by layers of organic polymer dielectric materials such as poly-p-xylylene (Parylene) to form a composite low dielectric constant dielectric layer.

Finally, Shin, in U.S. Pat. No. 5,807,768, discloses a method for forming a package of molded epoxy resin to encapsulate a semiconductor integrated circuit microelectronics fabrication and integral heat sink. The molded package is fabricated in two parts, the first being of greater bonding strength than the second, to afford greater resistance to delamination at the interface between the first molded part and the integrated circuit microelectronics fabrication integral heat sink combination.

Desirable in the art of microelectronics fabrication are additional methods and materials for forming passivation layers and molded organic polymer package structures with improved resistance to delamination or other structural failure modes.

It is towards these goals that the present invention is generally and specifically directed.

SUMMARY OF THE INVENTION

A first object of the present invention is to provide a method for forming upon a substrate employed within a microelectronics fabrication a dielectric layer with improved adhesion to encapsulating materials subsequently formed thereupon.

A second object of the present invention is to provide a method in accord with the first object of the present invention, where there is attenuated delamination of dielectric passivation layers formed over dielectric layers formed upon a substrate employed within an integrated circuit microelectronics fabrication and improved adhesion to organic polymer encapsulating materials formed thereover.

A third object of the present invention is to provide a method in accord with the first object of the present invention and/or the second object of the present invention, where the method is readily commercially implemented.

In accord with the objects of the present invention, there is provided a method for forming upon a substrate employed within a microelectronics fabrication a dielectric passivation layer with attenuated delamination from underlying dielectric layers and with improved adhesion to encapsulating materials subsequently formed thereupon. To practice the method of the present invention, there is first provided a substrate employed within a microelectronics fabrication. There is then formed upon the substrate a silicon containing dielectric layer employing the method of high density plasma chemical vapor deposition (HDP-CVD). There is then formed over the silicon containing dielectric passivation layer an additional passivation layer and an organic polymer material overcoat layer formed over and around the microelectronics fabrication as a protective package.

The present invention provides a method for forming a dielectric passivation layer over, and exhibiting attenuated delamination from, a silicon containing dielectric layer formed upon a substrate employed within a microelectronics fabrication, and for forming a molded organic polymer overcoat over the substrate with improved adhesion to the underlying passivation layer.

The method of the present invention may be advantageously employed within microelectronics fabrications including but not limited to integrated circuit microelectronics fabrications, charge coupled device microelectronics fabrications, solar cell microelectronics fabrications, light emitting diode microelectronics fabrications, ceramic substrate microelectronics fabrications and flat panel display microelectronics fabrications.

The method of the present invention employs materials and methods as are known in the art of microelectronics fabrications, but in a novel order, sequence and range of parameters. Hence the method of the present invention is readily commercially implemented.

BRIEF DESCRIPTION OF THE DRAWINGS

The objects, features, and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming upon a dielectric layer formed over a substrate employed within a microelectronics fabrication a dielectric passivation layer with attenuated delamination from layers formed thereunder, and improved adhesion to organic polymer overcoat layers fried thereover.

Figure 1:
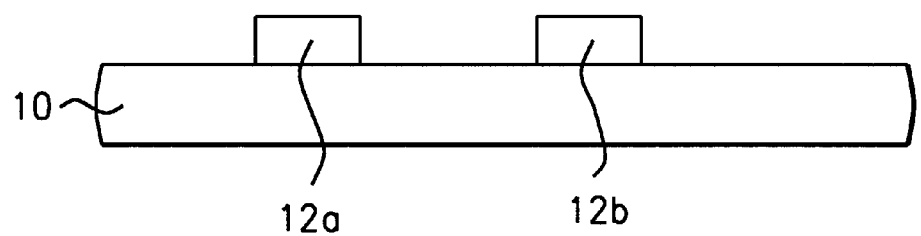
FIG. 1, FIG. 2 and FIG. 3 are directed towards a general embodiment of the present invention. Shown in FIG. 1 to FIG. 3 is a series of schematic cross-sectional diagrams illustrating the results of forming upon a substrate employed within a microelectronics fabrication a dielectric passivation layer with attenuated delamination from layers subsequently deposited thereon. and to enhanced adhesion to protective organic polymer overcoat layers formed thereupon.
Figure 2:
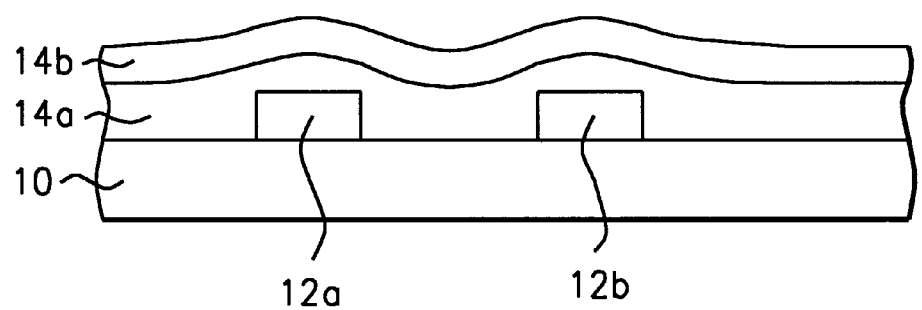
Figure 3:
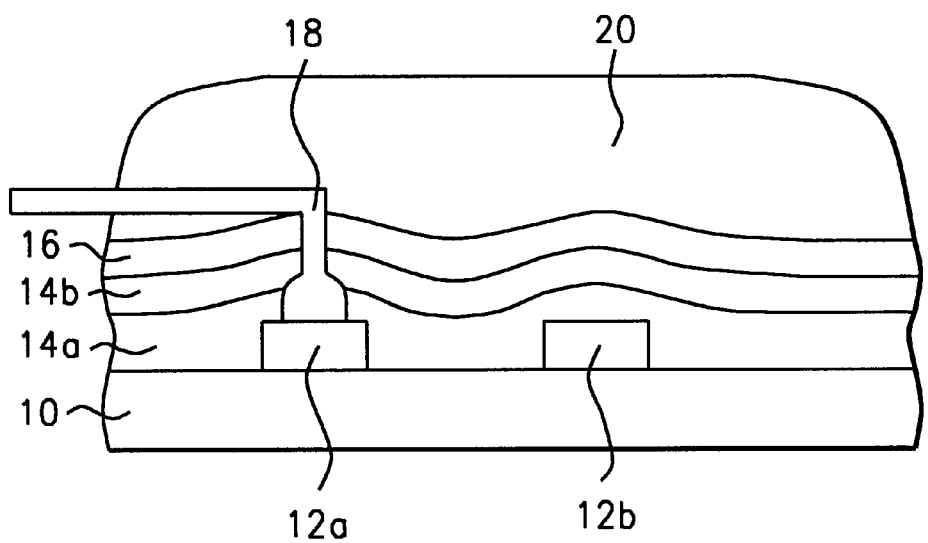

Referring now to FIG. 1 to FIG. 3, there is shown a series of schematic cross-sectional diagrams illustrating the results of forming upon a substrate employed within a microelectronics fabrication a dielectric passivation layer in accord with a general embodiment of the present invention. FIG. 1 is a schematic cross-sectional diagram of a microelectronics fabrication at an early stage in its fabrication.

Shown in FIG. 1 is a substrate 10 upon which is formed a series of patterned microelectronics layers 12a and 12b. The substrate 10 may be the substrate itself employed within the microelectronics fabrication, or alternatively, the substrate 10 may be the substrate employed within the microelectronics fabrication with any of several microelectronics layers formed thereupon. The substrate 10 may be selected from the group including but not limited to microelectronics conductor substrates, microelectronics semiconductor substrates and microelectronics dielectric substrates employed within microelectronics fabrications including but not limited to integrated circuit microelectronics fabrications, charge coupled device microelectronics fabrications, solar cell microelectronics fabrications, light emitting diode microelectronics fabrications, ceramic substrate microelectronics fabrications and flat panel display microelectronics fabrications.

With respect to the series of patterned microelectronics layers 12a and 12b, the series of patterned microelectronics layers 12a and 12b may be formed from microelectronics materials including but not limited to microelectronics conductor materials, microelectronics semiconductor materials and microelectronics dielectric materials. The microelectronics materials may be deposited employing methods as are known in the art of microelectronics fabrication including but not limited to thermal vacuum evaporation methods, electron beam evaporation methods, chemical vapor deposition (CVD) methods, physical vapor deposition (PVD) sputtering methods and reactive sputtering methods. Patterning of microelectronics layers may be accomplished employing photolithographic methods and materials as are known in the art of microelectronics fabrication.

Referring now more particularly to FIG. 2, there is shown a schematic cross-sectional diagram illustrating the results of further processing of the microelectronics fabrication whose schematic cross-sectional diagram is shown in FIG. 1. Shown in FIG. 2 is a microelectronics fabrication otherwise equivalent to the microelectronics fabrication shown in FIG. 1, but where there has been formed over and upon the substrate 10 a silicon containing dielectric layer 14a and 14b formed employing the method of high density plasma chemical vapor deposition (HDP-CVD).

With respect to the silicon containing dielectric layer 14a and 14b shown in FIG. 2, the silicon containing dielectric layer 14a and 14b is formed employing high density plasma chemical vapor deposition (HDP-CVD) wherein the deposition is done in two steps: the first portion of the dielectric layer 14a is deposited at a first lower deposition:sputter ratio to provide better gap filling, and the latter portion of the dielectric layer 14b is formed at a second higher deposition:sputter ratio to provide a topographically rougher surface of the silicon containing glass dielectric passivation layer 14b. Preferably, the high density plasma chemical vapor deposition (HDP-CVD) method employs the following process for the first portion 14a: (1) gas flow rates of argon of from about 110 to about 130 standard cubic centimeters per minute (sccm), oxygen from about 90 to about 110 standard cubic centimeters per minute (sccm), and silage ($SiH_4$) of from about 50 to about 60 standard cubic centimeters per minute (sccm); (2) total pressure of from about 4 to about 6 mtorr; (3) temperature of from about 400 to about 430 degrees centigrade; (4) source power of from about 4000 to about 5000 watts; (5) bias power of from about 2500 to about 3500 watts. For the second portion 14b, the HDP-CVD method preferably employs the following process; (1) gas flow rates of argon of from about 110 to about 130 standard cubic centimeters per minute (sccm), oxygen of from about 180 to about 200 standard cubic centimeters per minute (sccm) and silane ($SiH_4$) of from about 100 to about 110 standard cubic centimeters per minute (sccm); (2) total pressure of from about 7 to about 10 mtorr; (3) temperature from about 400 to about 430 degrees centigrade; (4) source power from about 4000 to about 5000 watts; (5) bias power from about 2500 to about 3500 watts. The silicon containing glass dielectric layer 14a and 14b is preferably formed to a total thickness of from about 8000 to about 12,000 angstroms.

Referring now more particularly to FIG. 3, there is shown a schematic cross sectional diagram illustrating the results of further processing of the microelectronics fabrication whose schematic cross-sectional diagram is shown in FIG. 2. Shown in FIG. 3 is a microelectronics fabrication otherwise equivalent to the microelectronics fabrication shown in FIG. 2, but where there has been formed upon the dielectric passivation layer 14b an additional dielectric passivation layer 16. A wire electrical lead 18 is bonded to a conductive portion of the patterned microelectronics layer 12a. Formed around the entire microelectronics fabrication is a molded organic polymer encapsulating structure 20.

With respect to the second dielectric passivation layer 16 shown in FIG. 3, the additional dielectric passivation layer 16 may be formed from silicon containing dielectric materials including but not limited to silicon oxide dielectric materials, silicon nitride dielectric materials and silicon oxynitride dielectric materials employing methods known in the art of microelectronics fabrication including but not limited to chemical vapor deposition (CVD) methods, plasma enhanced chemical vapor deposition (PECVD) methods, sub-atmospheric pressure thermal chemical vapor deposition (SACVD) methods, physical vapor deposition (PVD) sputtering methods and reactive sputtering methods. Although not shown in FIG. 3, the additional passivation layer comprising the dielectric passivation layer 16 may be formed from more than one additional dielectric layer. Preferably the additional dielectric passivation layer 16 is formed of silicon nitride dielectric material employing a plasma enhanced chemical vapor deposition (PECVD) method. Preferably the additional dielectric passivation layer 16 is formed to a thickness of from about 5000 to about 10,000 angstroms.

With respect to the wire lead electrical connection 18 shown in FIG. 3, the wire lead electrical connection 18 is fabricated employing materials and methods well known in the art of microelectronics fabrication.

With respect to the molded organic polymer overcoat layer 20 shown in FIG. 3, the molded organic polymer overcoat layer 20 is formed employing materials and methods which are known in the art of microelectronics fabrication. Preferably, the molded organic polymer overcoat layer is formed from an epoxy resin formulation suited to injection molding.

The beneficial effect of the present invention is observed with respect to the improvement of adhesion of molded organic polymer packaging structures to silicon containing dielectric materials formed into layers employing the method of high density plasma chemical vapor deposition (HDP-CVD), wherein the dielectric layers formed in this fashion possess excellent physical and chemical properties with respect stability and freedom from undesirable impurities. These properties render these dielectric materials desirable as dielectric passivation layers employed within microelectronics fabrications, but such dielectric materials tend to have smooth planarized surfaces such that adhesion to other materials formed thereon may not be adequate, and delamination between dielectric layers may occur. Additionally, poor adhesion of the organic polymer overcoat layer to the underlying passivation layer may also occur. The greater amount of surface topography which occurs during formation of silicon containing dielectric layers at high deposition:sputter rate ratios during high plasma density chemical vapor deposition (HDP-CVD) is therefore of beneficial effect to attenuate delamination and to improve adhesion of overlying layers. Conversely, the formation of silicon containing glass dielectric layers at low deposition:sputter rate ratios provides dielectric layers with better gap filling capability as is desirable for passivation of microelectronics fabrications.

As is understood by a person skilled in the art, the preferred embodiments of the present invention are illustrative of the present invention rather than limiting of the present invention. Revisions and modifications may be made to materials, structures and dimensions through which is provided the preferred embodiments of the present invention while still providing embodiments which are within the spirit and scope of the present invention, as defined by the appended claims.

What is claimed is:

1. A method for passivating a microelectronics fabrication comprising:

providing a substrate;

forming upon the substrate a patterned microelectronics layer;

forming over the patterned microelectronics layer a first portion of a first dielectric layer formed employing a high density plasma chemical vapor deposition (HDP-CVD) method employing a first deposition:sputtering ratio;

forming upon the first portion of the first dielectric layer a second and completing portion of the first dielectric layer formed employing a second high density plasma chemical vapor deposition (HDP-CVD) method employing a second deposition:sputtering ratio;

forming over the first dielectric layer one or more additional silicon containing dielectric passivation layer; and forming an overcoating molded organic polymer layer over the passivation layer and substrate.

2. The method of claim 1 wherein the substrate is employed within a microelectronics fabrication selected from the group consisting of:

integrated circuit microelectronics fabrications;

charge coupled device microelectronics fabrications;

solar cell microelectronics fabrications;

radiation emitting diode microelectronics fabrications;

ceramics substrate microelectronics fabrications; and flat panel display microelectronics fabrications.

3. The method of claim 1 wherein the patterned microelectronics layers are selected from the group of microelectronics materials comprising:

microelectronics conductor materials;

microelectronics semiconductor materials; and microelectronics dielectric materials.

4. The method of claim 1 wherein the first dielectric layer is formed by a two step high density plasma chemical vapor deposition (HDP-CVD) method comprising:

a first deposition step of a silicon containing glass dielectric material at a first lower deposition:sputtering ratio selected to optimize the gap filling quality of the silicon containing glass dielectric layer portion; and a second deposition step of a silicon containing glass dielectric material at a second higher deposition:sputtering ratio selected to optimize the surface topography of the silicon containing glass dielectric layer portion for subsequent attenuated delamination of additional overlying passivation layers and improved adhesion to an overcoating layer.

5. The method of claim 1 wherein the additional silicon containing dielectric passivation layer is formed employing plasma enhanced chemical vapor deposition (PECVD).

6. The method of claim 5 wherein the silicon containing dielectric material is selected from the group consisting of:

silicon nitride;

silicon oxynitride; and silicon oxide.

7. The method of claim 1 wherein the overcoating molded organic polymer layer is formed from an epoxy resin formulation suited for injection molding.

8. A method for passivating an integrated circuit microelectronics fabrication comprising:

providing a semiconductor substrate having formed therein integrated circuit components;

forming upon the semiconductor substrate a patterned microelectronics layer;

forming over the patterned microelectronics layer a first portion of a first silicon containing dielectric layer employing a high density plasma chemical vapor deposition (HDP-CVD) method employing a first lower deposition:sputter ratio optimized to fill a series of gaps defined by a series of patterns within the patterned microelectronics layer;

forming upon the first portion of the first silicon containing dielectric layer a second and completing portion of the first silicon containing dielectric layer employing a second higher deposition:sputtering ratio optimized to increase surface topography;

forming a silicon nitride dielectric passivation layer over the first silicon containing dielectric layer with attenuated delamination of the underlying portions of the first silicon containing dielectric layer;

attaching interconnection leads to the integrated circuit components; and forming an overcoating molded organic polymer layer over the silicon nitride passivation layer and semiconductor substrate with improved adhesion.

9. The method of claim 8 wherein the semiconductor substrate is a silicon semiconductor substrate.

10. The method of claim 8 wherein the first silicon containing dielectric layer is a silicon oxide dielectric layer.

11. The method of claim 8 wherein the passivation layer is a silicon nitride layer formed employing plasma enhanced (PECVD) chemical vapor deposition.

12. The method of claim 8 wherein the overcoating molded organic polymer layer is formed from epoxy resin formulated for injection molding.

13. The method of claim 8 wherein the interconnection leads are bonded to contact regions formed on the semiconductor substrate surface prior to molding the organic polymer overcoat upon and around the substrate.

* * * * *